United States Patent
Kim et al.

(10) Patent No.: US 6,255,176 B1
(45) Date of Patent: Jul. 3, 2001

(54) METHOD OF FORMING TRENCH FOR SEMICONDUCTOR DEVICE ISOLATION

(75) Inventors: Seo-Won Kim; Yun-Woong Hyun, both of Seoul (KR)

(73) Assignees: Anam Semiconductor Inc. (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/517,362

(22) Filed: Mar. 2, 2000

(30) Foreign Application Priority Data

Mar. 4, 1999 (KR) .................................................. 99-7157

(51) Int. Cl.$^7$ ......................... H01L 21/336; H01L 21/76
(52) U.S. Cl. ........................ 438/296; 438/404; 438/424; 438/435
(58) Field of Search .................................. 438/296, 404, 438/424, 435

(56) References Cited

U.S. PATENT DOCUMENTS 5,897,361 * 4/1999 Egawa .
6,093,618 * 7/2000 Chen et al. .
6,165,843 * 12/2000 Sung .

* cited by examiner

Primary Examiner—John F. Niebling
Assistant Examiner—Josetta I. Jones
(74) Attorney, Agent, or Firm—Skjerven Morrill MacPherson LLP; James E. Parsons

(57) ABSTRACT

A method of forming a trench for semiconductor device isolation includes the steps of making a trench at a device isolation area of a silicon wafer overlaid with a pad oxide and a nitride through photolithography and etching, forming a liner oxide at an inner wall of the trench, filling the trench through depositing an insulating layer onto the entire surface of the silicon wafer, densifying the insulating layer, and planarizing the densified insulating layer such that the insulating layer is left only at the inside of the trench. The step of forming the liner oxide includes the sub-steps of forming a first liner oxide through performing rapid thermal processing with respect to the silicon wafer with the trench, forming a second liner nitride on the first liner oxide through performing the rapid thermal processing with respect to the silicon wafer with the first liner oxide, and forming a third liner wet oxide on the second liner nitride through performing the rapid thermal processing with respect to the second liner nitride. The trench so formed has removed corners. The three rapid thermal processing may be performed in situ in a single rapid thermal processing machine without exposing the wafers to atmosphere.

13 Claims, 7 Drawing Sheets

METHOD OF FORMING TRENCH FOR SEMICONDUCTOR DEVICE ISOLATION

BACKGROUND OF THE INVENTION (a) Field of the Invention

The present invention relates to a method of forming a trench for semiconductor device isolation and, more particularly, to a method of forming a trench for semiconductor device isolation which exhibits good performance characteristics well adapted for serving in device miniaturization.

(b) Description of the Related Art

Generally, a local oxidation of silicon (LOCOS) technique has been used for device isolation purpose in the semiconductor fabrication process.

In the LOCOS technique, the silicon wafer itself is thermally oxidized while using a nitride for a mask, and requires only a small number of processing steps. For this reason, the resulting oxide involves lower degree of stress, and exhibits good insulating characteristics.

However, in the application of the LOCOS technique, the device isolation area takes a large volume that limits device miniaturization as well as involves occurrence of the so-called bird's beak.

In order to solve the above problems, a shallow trench isolation (STI) technique has been suggested.

In the STI technique, a shallow trench is made in the silicon wafer, and filled with an insulating material. In this structure, the device isolation area is small, and hence the resulting trench can be well adapted for device miniaturization.

FIGS. 1A to 1E schematically illustrate the steps of processing a shallow trench for device isolation according to a prior art.

As shown in FIG. 1A, a silicon wafer 1 is sequentially overlaid with a layer of pad oxide 2 and a layer of nitride 3. The pad oxide 2 is to relieve stress occurring between the silicon wafer 1 and the nitride 3. A photoresist film is coated onto the silicon wafer 1 over the pad oxide 2 and the nitride 3. The photoresist film is exposed to light through a patterning mask, and developed to thereby form a photoresist pattern 4.

As shown in FIG. 1B, the patterned silicon wafer 1 is put in a dry etching chamber, and the nitride 3 and the pad oxide 2 exposed through the mask pattern 4 are etched. Furthermore, the exposed silicon wafer 1 is also etched by a predetermined depth to thereby form a shallow trench at the device isolation area.

As shown in FIG. 1C, the photoresist pattern 4 is removed from the nitride 3, and the silicon wafer 1 is cleaned. Thereafter, the silicon wafer 1 is put in a furnace, and undergoes thermal oxidation therein at high temperature for a long time. As a result, a layer of densified liner oxide 5 having a thickness of several hundred angstroms or more is formed at the inner wall of the trench.

As shown in FIG. 1D, a large thickness of insulating layer 6 is deposited onto the entire surface of the silicon wafer 1 through chemical vapor deposition (CVD) such that the inside of the trench is completely buried by the insulating layer 6.

As shown in FIG. 1E, the insulating layer 6 is annealed and densified, and a photoresist film is then coated on the densified insulating layer 6. The photoresist film is exposed to light through a reverse mask that has a pattern reverse to that of the aforementioned patterning mask, and developed to form a photoresist pattern. The insulating layer 6 is etched by using the photoresist pattern such that the insulating layer 6 is left only at the trench area. The photoresist pattern is then removed, and the insulating layer 6 is planarized through chemical mechanical polishing (CMP) while utilizing the nitride 3 as a stopping layer for the polishing. In this way, the formation of a shallow trench for device isolation is completed.

In the trench formed by using the above-described technique, electric field is concentrated on the side wall edge corner of the trench at the device driving, and the edge corner exhibits weakness in channel leakage such as a stress-induced leakage (SILC). In this respect, it becomes necessary that the side wall edge corner of the trench should be rounded to endure against leakage.

In order to achieve such a corner rounding, chlorine (Cl) is conventionally used for the liner oxide formation step such that the side wall edge corner of the trench is etched during the thermal oxidation.

However, in the above technique, the corner rounding is insufficiently made, and chlorine remains at the interface between the silicon wafer and the liner oxide so that the contamination due to the chlorine content induces leakage in the presence of subsequent thermal processing steps.

SUMMARY OF THE INVENTION

It is an object of the present invention to provide a method of forming a trench for device isolation that can form a high-quality liner oxide in a short time and, at the same time achieve complete corner rounding.

This and other objects may be achieved by a method of forming a trench for semiconductor device isolation including the following steps. A trench is first made at a device isolation area of a silicon wafer overlaid with a layer of a pad oxide and a layer of a nitride through photolithography and etching. A liner oxide is then formed at an inner wall of the trench, and the trench is filled through depositing an insulating layer onto the entire surface of the silicon wafer. The insulating layer is densified, and planarized such that the insulating layer is left only at the inside of the trench. The step of forming the liner oxide includes the following sub-steps. A first liner oxide is formed through performing rapid thermal processing with respect to the silicon wafer with the trench. A second liner nitride is then formed on the first liner oxide through performing the rapid thermal processing with respect to the silicon wafer with the first liner oxide. Finally, a third liner wet oxide is formed on the second liner nitride through performing the rapid thermal processing with respect to the silicon wafer with the second liner nitride.

The step of forming the first liner oxide is performed at 1050° C. or more for 100 seconds or more under a dry atmosphere. The step of forming the second liner nitride is performed at 1050° C. or more. The step of forming the third liner wet oxide is performed at 1050° C. or more for 20 seconds or more under a wet atmosphere.

The formation of the first liner oxide, the second liner nitride and the third liner wet oxide is performed through in situ processing with the same rapid thermal processing equipment without air-opening.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE EXEMPLARY EMBODIMENTS

The applicant claims priority to Korean patent application 99-7157, which was filed in the Korean Industrial Property Office on Mar. 4, 1999, and is incorporated herein by reference.

Exemplary embodiments of this invention will be explained with reference to the accompanying drawings.

FIGS. 2A to 2G schematically illustrate the steps of processing a shallow trench for device isolation according to an embodiment of the present invention.

Figure 1A:
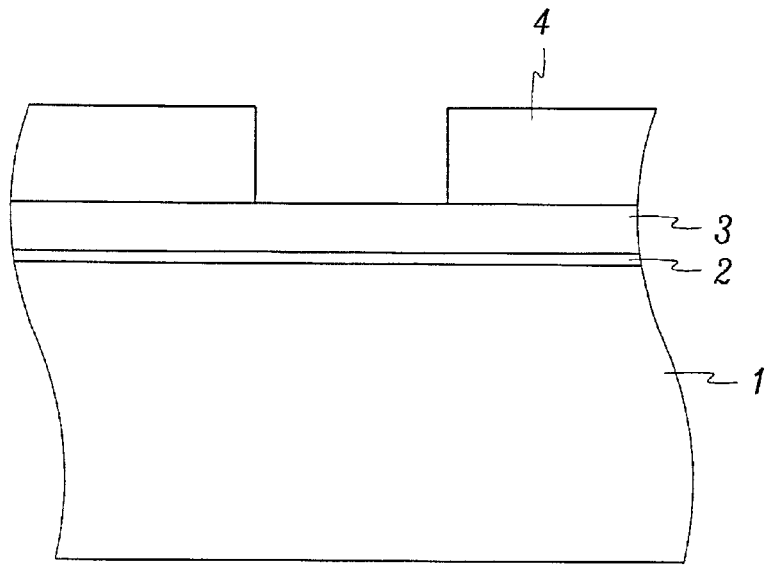
FIGS. 1A to 1E are schematic views illustrating the steps of processing a shallow trench for device isolation according to a prior art method.
Figure 1B:
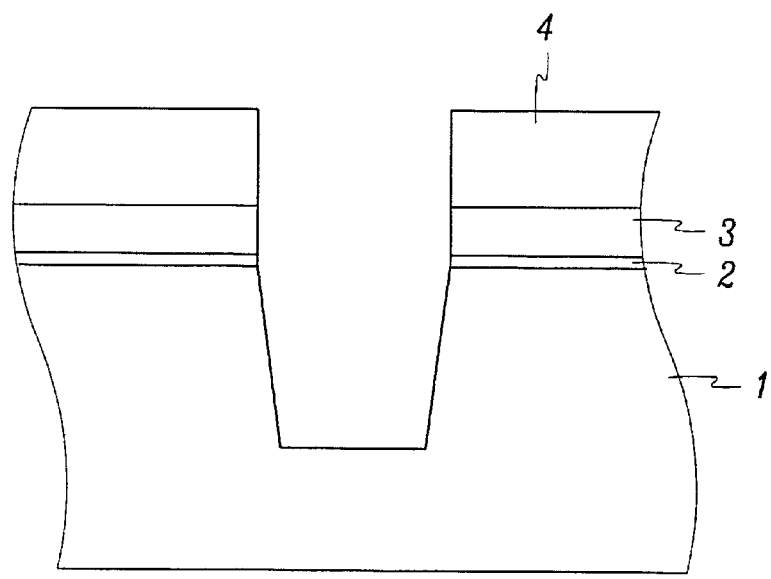
Figure 1C:
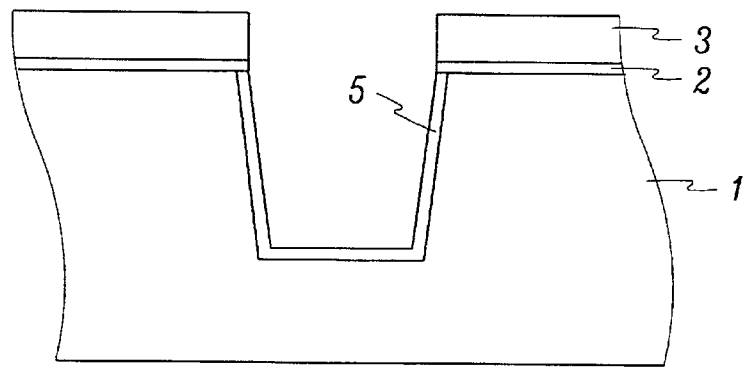
Figure 1D:
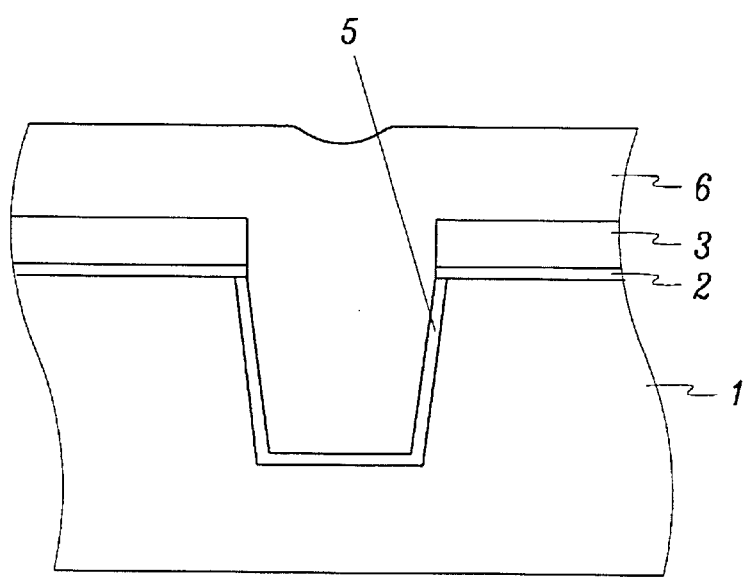
Figure 1E:
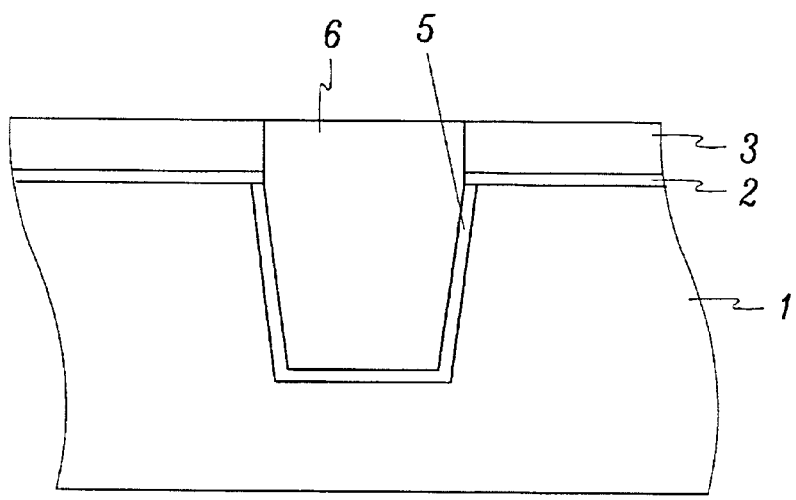
Figure 2A:
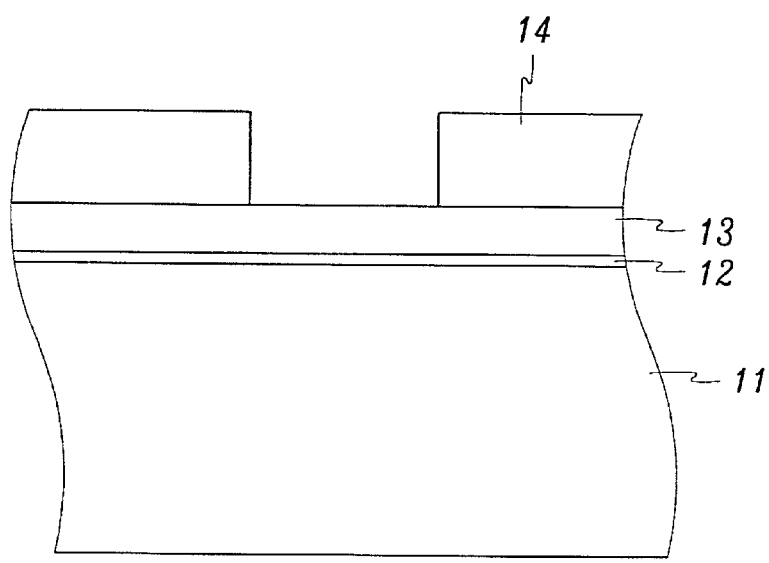
FIGS. 2A to 2G are schematic views illustrating the steps of processing a shallow trench for device isolation according to an exemplary embodiment of the present invention.

As shown in FIG. 2A, a silicon wafer 11 is sequentially overlaid with a layer of pad oxide 12 and a layer of nitride 13. The pad oxide 12 is to relieve stress occurring between the silicon wafer 11 and the nitride 13. A photoresist film is then coated onto the silicon wafer 11 over the pad oxide 12 and the nitride 13. The photoresist film is exposed to light through a patterning mask to thereby form a photoresist pattern 14.

Figure 2B:
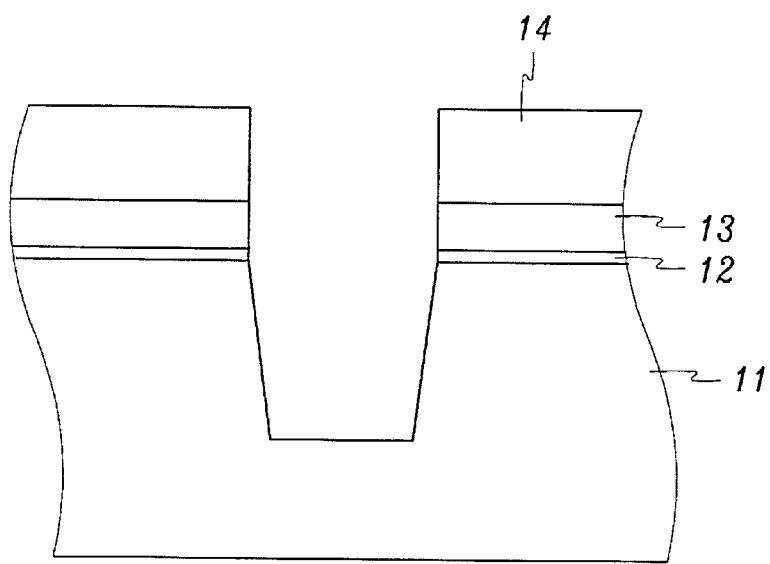

As shown in FIG. 2B, the silicon wafer 11 is put in a dry etching chamber and, the nitride 13 and the pad oxide 12 exposed through the photoresist pattern 14 are etched and removed. The exposed silicon wafer 11 exposed through the etching is also etched by a predetermined depth to thereby form a shallow trench at the device isolation area.

Figure 2C:
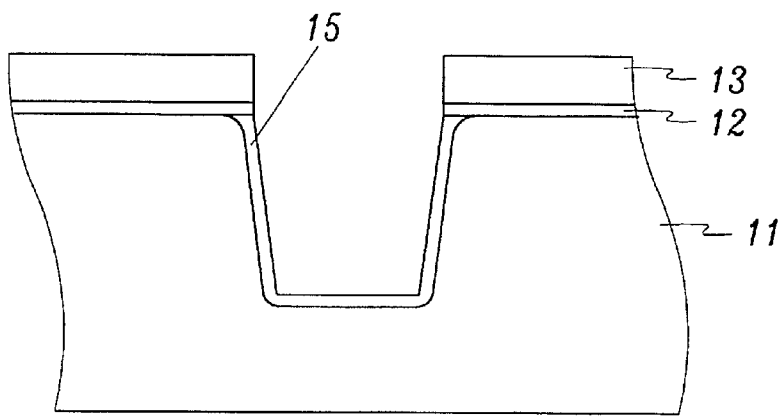

As shown in FIG. 2C, the photoresist pattern 14 is removed from the nitride 13, and the silicon wafer 11 is cleaned. Then, the silicon wafer 11 is dry-oxidized through rapid thermal processing ("RTP") in an RTP machine at 1050° C. or more for 100 seconds or more to thereby form a first liner oxide 15 at the inner wall of the trench. At this time, as the unit volume of the side wall edge corner of the trench is larger than that of the side and bottom walls of the trench, oxygen is more intruded into the silicon wafer 11 at the corner portion. Consequently, thermal oxidation rate at the side wall edge corner of the trench becomes enhanced so that the desired corner rounding is naturally accomplished.

Figure 2D:
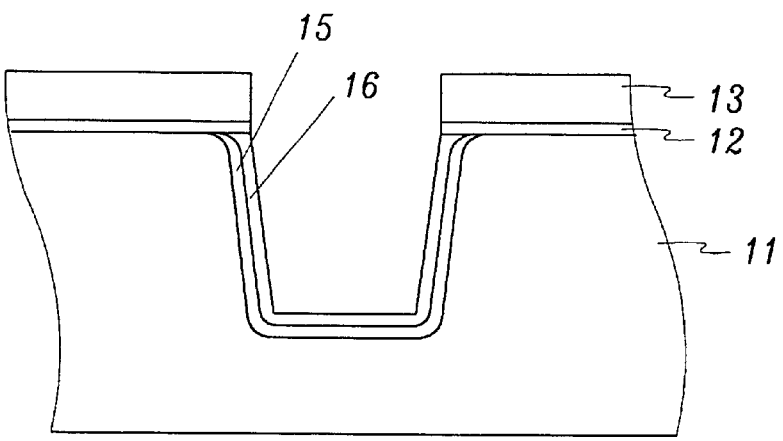

As shown in FIG. 2D, the silicon wafer 11 was heat-treated through RTP at 1050° C. or more so that a layer of a second liner nitride 16 having a high dielectric coefficient is formed on the first liner oxide 15. Considering that the dielectric coefficient of the oxide is only 3.8, but that of the nitride reaches 7, it can be estimated that the second liner nitride 16 may well improve the insulating characteristic of the trench.

Figure 2E:
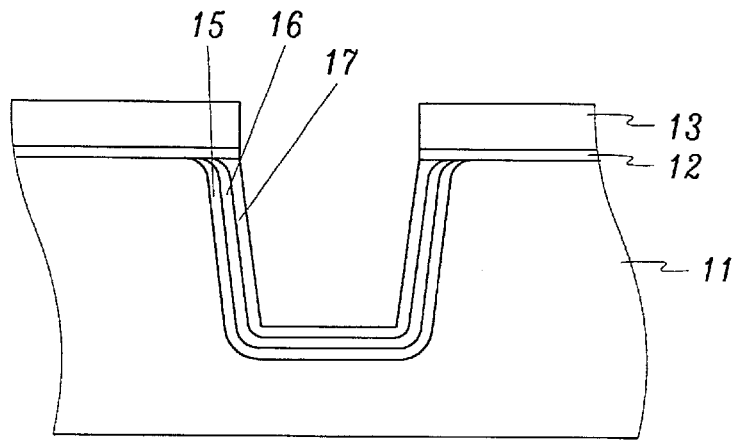

As shown in FIG. 2E, the silicon wafer 11 is wet-oxidized through RTP at 1050° C. or more for 20 seconds or more under a steam-containing oxygen gas atmosphere so that a layer of a third liner wet oxide 17 is formed on the second liner nitride 16. Considering that the stress working at the interface between the nitride and the silicon wafer 11 is up to $9.5 \times 10^9$ dyne/cm$^2$ while the stress at the interface between the oxide and the silicon wafer being $3 \times 10^9$ dyne/cm$^2$ the third liner wet oxide 17 is to relieve such an interfacial stress, and to function as a seed for trench filling.

The formation of the first liner oxide 15, the second liner nitride 16 and the third liner wet oxide 17 is performed through in situ processing with the same rapid thermal processing equipment without air-opening so that deterioration in the throughput can be prevented.

Figure 2F:
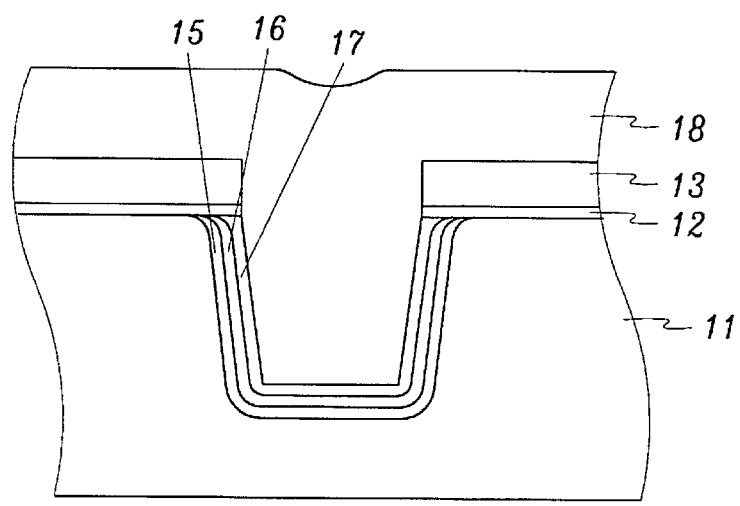

As shown in FIG. 2F, a large thickness of insulating layer 18 is deposited onto the entire surface of the silicon wafer 11 through the CVD such that the insulating material completely fills the inside of the trench. Thereafter, the insulating layer 18 is annealed, and densified.

Figure 2G:
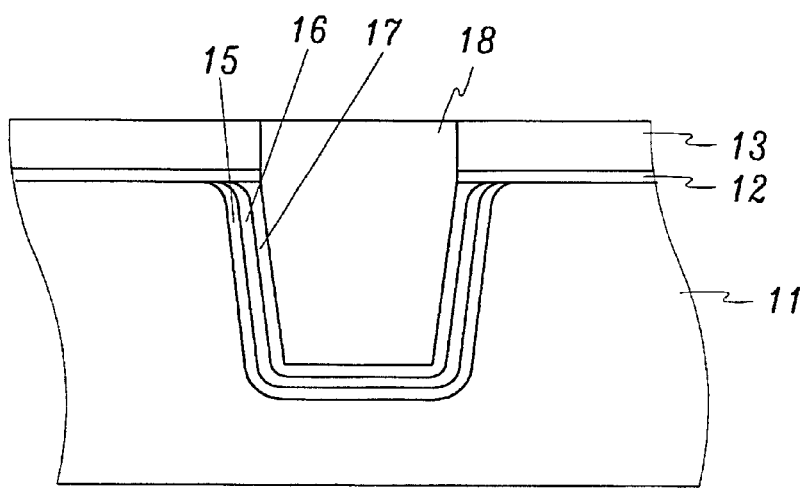

As shown in FIG. 2G, a photoresist film is coated onto the insulating layer 18. The photoresist film is exposed to light through a reverse mask that has a pattern reverse to that of the aforementioned patterning mask, and developed to thereby form a photoresist pattern. The insulating layer 18 is then etched by using the photoresist pattern for a mask (photolithography). Thereafter, the insulating layer 18 is planarized through chemical mechanical polishing (CMP) while utilizing the nitride 13 as a stopping layer for the polishing. In this way, the formation of a shallow trench for device isolation is completed.

As described above, the inventive trench formation method makes it possible that a high quality of liner oxide is produced with a complete corner rounding. Therefore, it is well adapted for use in the shallow trench processing for device isolation and hence for serving in device miniaturization, and involves improved device isolation and latchup characteristics.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of forming a trench for semiconductor device isolation comprising the steps of:
   making a trench at a device isolation area of a silicon wafer overlaid with a pad oxide layer and a nitride layer by photolithography and etching;
   forming a liner oxide at an inner wall of the trench;
   filling the trench through depositing an insulating layer onto the entire surface of the silicon wafer; and
   densifying the insulating layer, and planarizing the densified insulating layer such that the insulating layer is left only at the inside of the trench,
   wherein forming the liner oxide includes forming a first liner oxide through performing rapid thermal processing with respect to the silicon wafer with the trench, forming a second liner nitride on the first liner oxide through performing the rapid thermal processing with respect to the silicon wafer with the first liner oxide, and forming a third liner wet oxide on the second liner nitride through performing the rapid thermal processing with respect to the silicon wafer with the second liner nitride.

2. The method of claim 1, wherein the step of forming the first liner oxide is performed at 1050° C. or more for 100 seconds or more under a dry atmosphere.

3. The method of claim 1, wherein the step of forming the second liner nitride is performed at 1050° C. or more.

4. The method of claim 1, wherein the step of forming the third liner wet oxide is performed at 1050° C. or more for 20 seconds or more under a wet atmosphere.

5. The method of claim 4, wherein the formation of the first liner oxide, the second liner nitride and the third liner wet oxide is performed through in situ processing with the same rapid thermal processing equipment without exposure to atmosphere.

6. The method of claim 1, wherein the formation of the first liner oxide, the second liner nitride and the third liner wet oxide is performed through in situ processing with the same rapid thermal processing equipment without exposure to atmosphere.

7. A method of forming a trench for semiconductor device isolation, the method comprising:

making a trench at a device isolation area of a silicon wafer overlaid with a pad oxide layer and a nitride layer, said trench having corners;

forming in the trench through rapid thermal processing a first liner oxide layer on the silicon wafer, a second liner nitride layer on the first liner oxide, and a third liner wet oxide layer on the second liner nitride, while also rounding corners of the trench;

depositing an insulating layer onto the silicon wafer so as to fill said lined trench;

densifying the insulating layer, and planarizing the densified insulating layer such that the insulating layer is left only within the trench.

8. The method of claim 7, wherein forming the first liner oxide is performed at 1050° C. or more for 100 seconds or more under a dry atmosphere.

9. The method of claim 7, wherein forming the second liner nitride is performed at 1050° C. or more.

10. The method of claim 7, wherein forming the third liner wet oxide is performed at 1050° C. or more for 20 seconds or more under a wet atmosphere.

11. The method of claim 7, wherein forming the first liner oxide is performed at 1050° C. or more for 100 seconds or more under a dry atmosphere; forming the second liner nitride is performed at 1050° C. or more, and forming the third liner wet oxide is performed at 1050° C. or more for 20 seconds or more under a wet atmosphere.

12. The method of claim 11, wherein forming the first liner oxide, the second liner nitride, and the third liner wet oxide is performed through in situ processing in a single rapid thermal processing machine without exposure to atmosphere.

13. The method of claim 7, wherein forming the first liner oxide, the second liner nitride, and the third liner wet oxide is performed through in situ processing in a single rapid thermal processing machine without exposure to atmosphere.

* * * * *